(12) United States Patent
Lianto et al.

(10) Patent No.: US 10,515,927 B2
(45) Date of Patent: Dec. 24, 2019

(54) METHODS AND APPARATUS FOR SEMICONDUCTOR PACKAGE PROCESSING

(71) Applicant: APPLIED MATERIALS, INC., Santa Clara, CA (US)

(72) Inventors: Prayudi Lianto, Singapore (SG); Guan Huei See, Singapore (SG); Arvind Sundarrajan, Singapore (SG); Ranga Rao Arnepalli, Krishna (IN); Prerna Goradia, Mumbai (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/634,012

(22) Filed: Jun. 27, 2017

(65) Prior Publication Data
US 2018/0308822 A1 Oct. 25, 2018

Related U.S. Application Data

(60) Provisional application No. 62/488,323, filed on Apr. 21, 2017.

(51) Int. Cl.
*H01L 21/48* (2006.01)
*H01L 23/00* (2006.01)
(Continued)

(52) U.S. Cl.
CPC ........ *H01L 24/96* (2013.01); *H01L 21/02118* (2013.01); *H01L 21/02282* (2013.01);
(Continued)

(58) Field of Classification Search
CPC . H01L 2924/00014; H01L 2224/73265; H01L 2224/32225; H01L 2224/97; H01L 21/304; H01L 21/568; H01L 2224/04105
See application file for complete search history.

(56) References Cited

U.S. PATENT DOCUMENTS 8,890,284 B2 * 11/2014 Kilger ................ H01L 21/82
  257/528
2006/0220262 A1 * 10/2006 Meyer ............... H01L 21/568
  257/779
(Continued)

FOREIGN PATENT DOCUMENTS

JP 2004/205440 A 7/2004
JP 2005-191270 A 7/2005
(Continued)

OTHER PUBLICATIONS

Ultra Fine Pitch RDL Development in Multi-layer eWLB (embedded Wafer Level BGA) Packages, Won Kyoung Choi, Duk Ju Na, Kyaw Oo Aung, Andy Yong, Jaesik Lee, Urrni Ray, Riko Radojcic, Bernard Adams and Seung Wook Yoon, IMAPS 2015 Orlando—48th Annual International Symposium on Microelectronics—Oct. 26-29, 2015, 5 pages.
(Continued)

*Primary Examiner* — Jaehwan Oh
(74) *Attorney, Agent, or Firm* — Moser Taboada; Alan Taboada

(57) ABSTRACT

A fan-out process using chemical mechanical planarization (CMP) reduces the step-height between a semiconductor die and the surrounding overmolding of a reconstituted wafer. The reconstituted wafer is formed by overmolding a back side of at least one die that is placed with an active side facing down. The reconstituted wafer is then oriented to expose the die and the active side. A polymer layer is then formed over the reconstituted wafer. A CMP process then removes a portion of the polymer layer until a certain thickness above the die surface is obtained, reducing the step-height between the polymer layer on top of the die surface and the polymer layer on the adjacent mold compound surface. The CMP process can also be performed after
(Continued)

a subsequent redistribution layer is formed on the reconstituted wafer.

17 Claims, 5 Drawing Sheets

(51) Int. Cl.
    *H01L 21/02*     (2006.01)
    *H01L 21/3105*     (2006.01)
    *H01L 21/56*     (2006.01)

(52) U.S. Cl.
    CPC .... *H01L 21/31053* (2013.01); *H01L 21/4857* (2013.01); *H01L 21/568* (2013.01); *H01L 2224/95001* (2013.01)

(56) References Cited

U.S. PATENT DOCUMENTS

| | | | | |
|---|---|---|---|---|
| 2011/0057018 | A1* | 3/2011 | Eldridge | B23K 20/004 |
| | | | | 228/159 |
| 2014/0110856 | A1* | 4/2014 | Lin | H01L 24/19 |
| | | | | 257/774 |
| 2015/0008595 | A1 | 1/2015 | Hu | |
| 2017/0077022 | A1* | 3/2017 | Scanlan | H01L 23/49838 |
| 2017/0256432 | A1* | 9/2017 | Burmeister | H01L 24/05 |

FOREIGN PATENT DOCUMENTS

| | | |
|---|---|---|
| KR | 10-2017-0019298 A | 2/2017 |
| WO | WO 2016-164119 A1 | 10/2016 |

OTHER PUBLICATIONS

Yole Developpement, PERSPECTIVESThe Growth of Advanced Packaging Technology Overview, Applications and Market Trends Semicon Taiwan Taipei, Sep. 1, 2015, Rozalia Beica Chief Technology Officer beica@yole.fr, 52 pages.

Patent Issues of Embedded Fan-Out Wafer/Panel Level Packaging, John H. Lau, ASM Pacific Technology, Hong Kong, China, John.lau@asmpt.com, 7 pages.

PCT International Search Report and Written Opinion dated Jul. 27, 2018 for PCT Application No. PCT/US 2018/026677.

* cited by examiner

METHODS AND APPARATUS FOR SEMICONDUCTOR PACKAGE PROCESSING

CROSS-REFERENCE TO RELATED APPLICATIONS

This application claims benefit of U.S. provisional patent application Ser. No. 62/488,323, filed Apr. 21, 2017, which is herein incorporated by reference.

FIELD

Embodiments of the present principles generally relate to semiconductor processes used in packaging semiconductor devices.

BACKGROUND

A semiconductor wafer is processed to form structures on the wafer surface. The structures on a particular region of the wafer can be linked together to form a microcircuit. The wafer may have many different microcircuits constructed on the wafer's surface during processing. Once the wafer has finished being processed, the wafer is cut apart or singulated to separate the microcircuits into semiconductor 'chips.' The chips often contain complex circuitry which needs to interact with external components. The chip's internal circuitry is too minute to be connected directly to the external components. To overcome the external connection issues, lead outs are formed that are connected to the internal circuitry of a chip to a pad or solder ball that allows for external connections. The lead outs are formed in what is known as a 'redistribution layer' during follow-on package processing of the semiconductor chips.

Chips from different wafers may be combined together by placing the chips on a surface and pouring a molding compound over the chips to again form a new wafer or a 'reconstituted' wafer. The molding compound hardens so that the chips can be handled in unison for redistribution layer processing. A common technique is to bond the reconstituted wafer to a temporary carrier to provide rigidity during processing. However, the temporary bonding and then debonding is expensive and time consuming. In addition, the techniques that use a temporary carrier also require additional processing steps that add to the costs and decrease the throughput for redistribution layer processes.

Thus, the inventors have provided an improved method and apparatus for redistribution layer processing.

SUMMARY

In some embodiments, a method of processing a semiconductor substrate comprises overmolding a non-active side of the at least one die to form a reconstituted wafer; orienting the reconstituted wafer to expose a first side with the active side of the at least one die; depositing a first layer of material on the first side of the reconstituted wafer; depositing a first layer of material on the first side of the reconstituted wafer; and planarizing the first layer of material without exposing the active side of the at least one die. In some embodiments, the method may further include one, more than one, or all of the following—forming at least one via in the first layer of material after planarizing the first layer of material, the via electrically connecting with the at least one die and extending to a first surface of the first layer of material; forming a first redistribution layer on the reconstituted wafer, depositing a second layer of material over the first redistribution layer, and planarizing the second layer of material formed on the first redistribution layer; forming a redistribution layer on the at least one active side with at least two lead outs with line and spacing of approximately greater than 0/0 µm to less than or equal to approximately 2/2 µm, forming at least one via in the second layer of material after planarizing the second layer of material, the via electrically connecting with the first redistribution layer and extending to a second surface of the second layer of material; using a carrier on the second side of the reconstituted wafer to provide rigidity during subsequent processing; creating structures on the reconstituted wafer before depositing the layer of material on the reconstituted wafer; the layer of material is a polymer-based material; the planarizing process is a chemical-mechanical planarization process; and/or depositing at least one layer of material on the reconstituted wafer using a spin coating process.

In some embodiments, a method of processing a semiconductor substrate comprises placing at least one die on a substrate surface with at least one active side of the at least one die towards the substrate surface; overmolding at least one non-active side of the at least one die to form a reconstituted wafer; curing the overmolding; releasing the reconstituted wafer from the substrate surface and exposing a first side of the reconstituted wafer with the at least one active side of the at least one die; spin coating a first polymer layer on the first side of the reconstituted wafer; and chemical-mechanical planarizing the first polymer layer to reduce step-height distance in the proximity of a transition point of the at least one die and an adjacent surface. In some embodiments, the method may further include one, more than one, or all of the following—reducing at least one step-height until the at least one step-height is approximately greater than 0 µm to less than or equal to approximately 1 µm; forming at least one via in the first polymer layer after chemical-mechanical planarizing the first polymer layer, the via electrically connecting with the at least one active side of the at least one die and extending to a first surface of the first polymer layer; forming a first redistribution layer on the reconstituted wafer, spin coating a second polymer layer over the first redistribution layer, and chemical-mechanical planarizing the second polymer layer formed on the first redistribution layer; forming a redistribution layer on the at least one active side with at least two lead outs with line and spacing of approximately greater than 0/0 µm to less than or equal to approximately 2/2 µm; forming at least one via in the second polymer layer after chemical-mechanical planarizing the second polymer layer, the via electrically connecting with the first redistribution layer and extending to a second surface of the second polymer layer; using a carrier on a second side of the reconstituted wafer to provide rigidity during processing and/or creating structures on the reconstituted wafer before depositing the first polymer layer on the reconstituted wafer.

In some embodiments, a semiconductor component comprises a back-overmolded die having an active side and a redistribution layer on the active side with at least two lead outs with line and spacing of approximately greater than 0/0 µm to less than or equal to approximately 2/2 µm. In some embodiments, at least one step-height between a transition of a surface of the active side of the back-overmolded die and an adjacent surface is also included, the step-height approximately greater than 0 µm to less than or equal to approximately 1 µm.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1A:
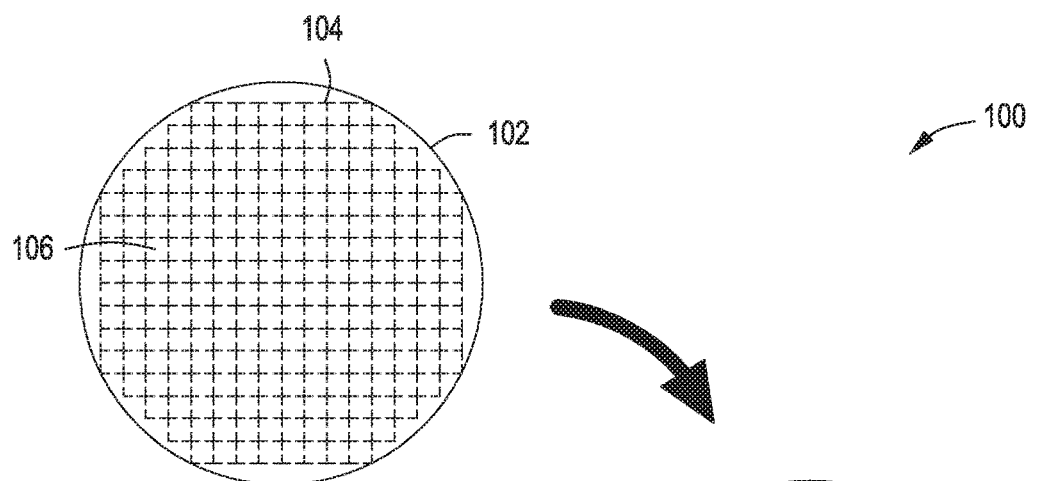
FIGS. 1A-1D respectively depict stages of a process to create a reconstituted wafer in accordance with some embodiments of the present principles.
Figure 1B:
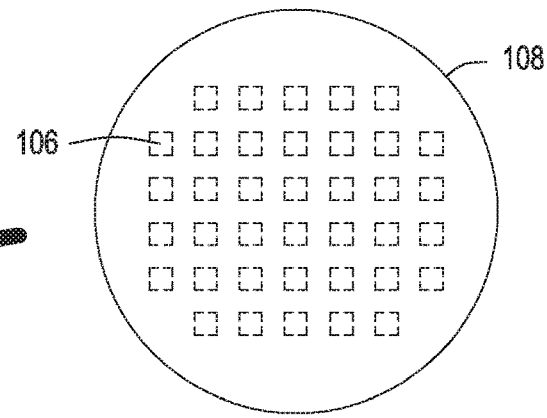

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

A chemical mechanical planarization (CMP) process is used to enable fine pitch patterning of a redistribution layer (RDL). The fine pitch patterning is accomplished by reducing the step-height between a die and overmolding on a reconstituted wafer. The process advantageously provides a lower cost and higher throughput method of creating an RDL with the benefit of increased input/output (I/O) capabilities. The process can also be performed without a carrier for the reconstituted wafer. Another advantage is that differences between step-height for different die or chip sizes are automatically compensated for by the process. The automatic compensation is beneficial as the automatic compensation enables robust die-to-die interconnect for system-in-package (SiP) integration. The process can be accomplished in various manners and process flows. For the sake of brevity, the examples given are based on using molded wafer reconstitution.

Figure 1C:
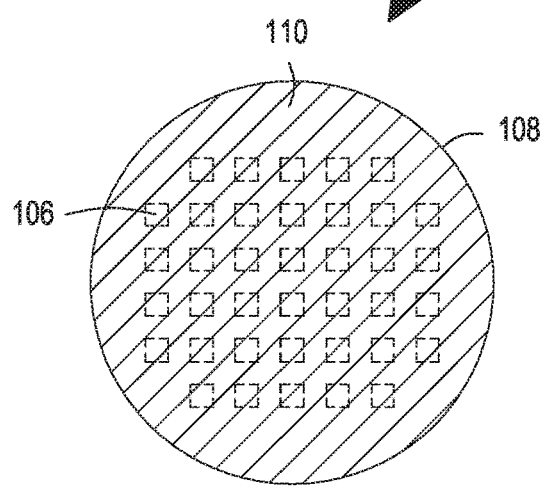
Figure 1D:
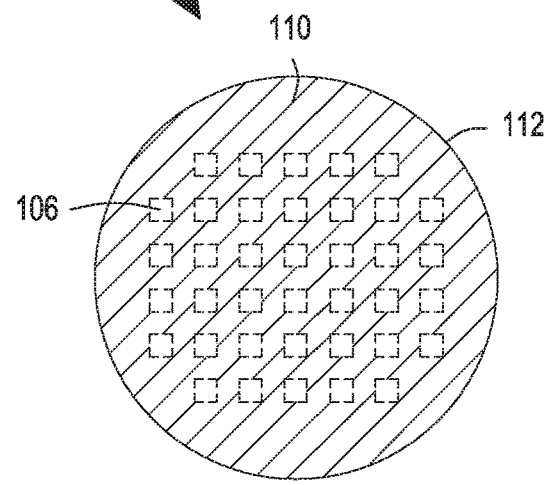

FIGS. 1A-1D respectively illustrate a process 100 for forming a reconstituted wafer. Initially, in FIG. 1A, a substrate 102 is used to form semiconductor structures through deposition, etching, and electroplating, etc. Identical structures are typically formed across the surface of the substrate 102 indicated by a grid pattern 104. Each square is a chip or 'die' such as die 106. For the sake of brevity, the die 106 will be used as an example through the subsequent processes. However, any one or all of the dies of a wafer can be processed similar to those processes described for die 106. The substrate 102 is cut apart or singulated into individual dies (which includes die 106). In some embodiments shown in FIG. 1B, die 106 is picked and placed along with other dies (from the same wafer and/or other singulated wafers) on a new substrate 108. The die 106 is placed in such a way on the new substrate 108 that a side ("active side") of the die 106 that an RDL is to be formed on is oriented down (e.g., "face" or active side down). The dies are typically spaced apart to allow room for lead outs to be formed during subsequent RDL formation. The spacing allows for the lead outs to 'fan-out,' and the process to accomplish the lead out spacing is typically referred to as fan-out wafer-level packaging (FOWLP). In FIG. 1C, an overmolding compound 110 is then poured over the active side down dies, including die 106. The overmolding compound 110 typically covers the entire backside of the dies. When the overmolding compound 110 is cured, the overmolding compound 110 is released from the new substrate 108 forming a reconstituted wafer 112. The reconstituted wafer 112 is then oriented (e.g., flipped over) to expose the active sides of the dies, such as die 106, as depicted in FIG. 1D. If a process is used where the dies are suspended in the overmolding compound 110 which is cured with the active sides up, the reconstituted wafer 112 would not need to be flipped before subsequent processing. The die 106 in FIG. 1D is now embedded into the reconstituted wafer 112 and in an active side up orientation (RDL side is exposed).

Figure 2:
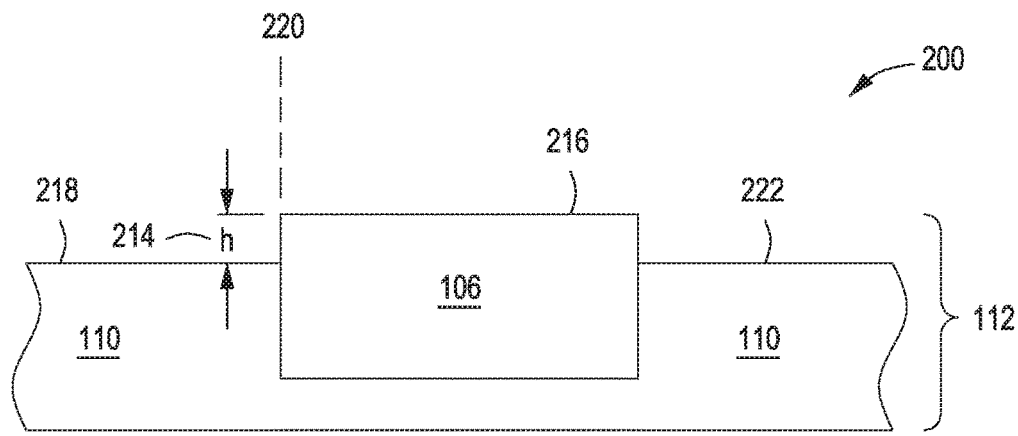
FIG. 2 depicts a cross sectional view of a reconstituted wafer in accordance with some embodiments of the present principles.

FIG. 2 shows a cross section 200 of the die 106 and a portion of the reconstituted wafer 112. The die 106 is shown embedded in the overmolding compound 110 in an active side up orientation (RDL side exposed). A top surface 216 of the die 106 typically protrudes upward beyond an adjacent top surface 218, such as, for example, a top surface 222 of the overmolding compound 110. The protrusion creates a step-height 214 of distance h in proximity of a transition point 220 between the die 106 and an adjacent top surface 218. A step-height is defined as a differential height distance between a surface above a die and an adjacent surface at a transition point between a die and another material. The step-height 214 restricts RDL patterning resolution (line width and also spacing of lead outs in an RDL). Current technologies available do not address producing ultra-fine pitch RDL across step-heights such as those formed in subsequent processing layers due to the step-height 214.

Reduction of subsequent step-heights caused by the step-height 214 using embodiments of the present principles advantageously permits a finer pitch in the RDL. Some embodiments reduce step-heights to produce a step-height at the die/adjacent surface transition point of approximately 0.0 μm to less than or equal to approximately 1.0 μm for subsequent processing layers. The step-height reduction allows for finer pitched RDL with reduced L/S (line and spacing) which beneficially permits smaller chip construction and/or more lead outs in a given amount of space. Some embodiments of the present principles advantageously permit L/S of less than approximately 2/2 μm across the die/adjacent surface transition point. Some embodiments also advantageously have fewer processes, consumables, and equipment over traditional methods, saving costs, time, and using less equipment.

Figure 3:
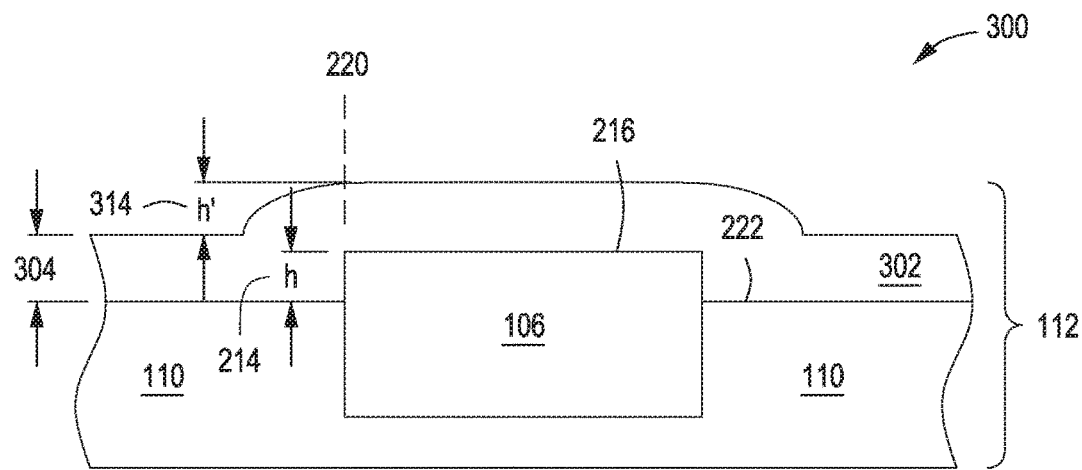
FIG. 3 depicts a cross sectional view of a reconstituted wafer with a polymer layer in accordance with some embodiments of the present principles.

In FIG. 3, a first layer of material 302 is deposited on the reconstituted wafer 112, covering the overmolding compound 110 and the die 106 as shown in a cross section 300 of the die 106 and a portion of the reconstituted wafer 112. The first layer of material 302 is typically uniform in thickness and will be higher in absolute height over the die 106 than over the overmolding compound 110. The height difference (step-height h' 314) is the reason for the inability to pattern fine-pitch RDL across the die-mold interface. At present, the resulting step height h' is not addressed in the industry. The layer of material 302 is deposited such that a thickness 304 of the first layer of material 302 on the top surface 222 of the overmolding compound 110 is approximately equal to or greater than the top surface 216 of the die 106. The first layer of material 302 can include, for example, a polymer-based material and other materials. In some embodiments, additional structures (not shown) (e.g., copper interconnects, etc.) can be formed on the reconstituted wafer 112 after the deposition of the first layer of material 302.

Figure 4:
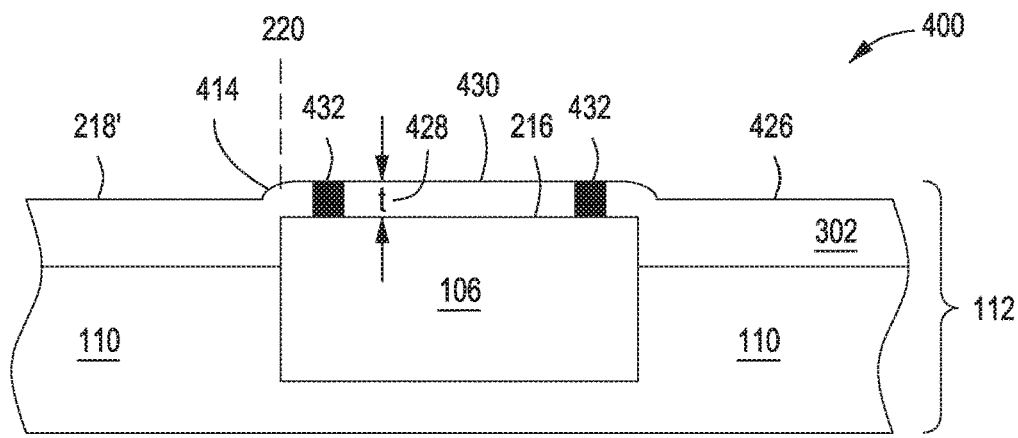
FIG. 4 depicts a cross sectional view of a reconstituted wafer after a chemical-mechanical process in accordance with some embodiments of the present principles.

In FIG. 4, a cross section 400 of the die 106 and a portion of the reconstituted wafer 112 is shown after a planarization process. The planarization process such as, for example, a CMP process, reduces the first layer of material 302 until a certain thickness t 428 above the top surface 216 of the die 106 is obtained. A step-height 414 between a surface 430 above the die 106 and the adjacent top surface 218' (now top surface 426 of the first layer of material 302 above the overmolding compound 110) in proximity of the transition point 220 is substantially reduced when compared to the step-height h' 314. Subsequent RDLs can be planarized as well to reduce step-heights. If the initial step-height (e.g., step-height h' 314) is substantially reduced, the reduction may eliminate any reason to perform subsequent planarization. In some embodiments, at least one via 432 can be created in the layer of material 302 after planarization. The at least one via 432 electrically connects with the die 106 and extends to the surface 430 of the first layer of material 302.

Figure 5:
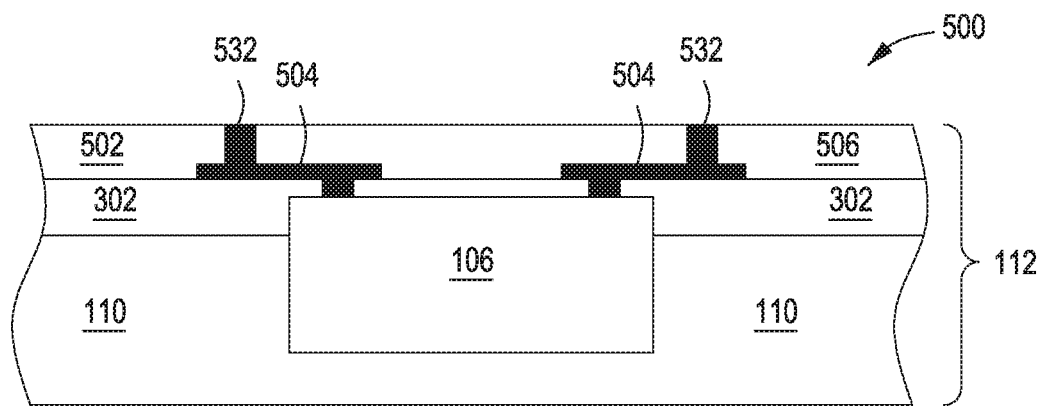
FIG. 5 depicts a cross sectional view of a reconstituted wafer with a single redistribution layer in accordance with some embodiments of the present principles.
Figure 6:
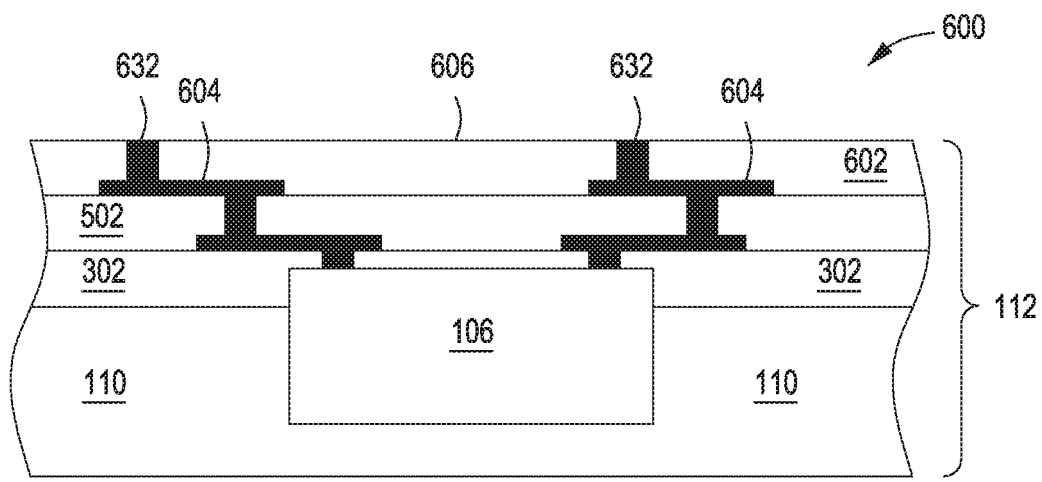
FIG. 6 depicts a cross sectional view of a reconstituted wafer with multiple redistribution layers in accordance with some embodiments of the present principles.

FIG. 5 shows a cross section 500 after a second layer of material 502 has been formed on the reconstituted wafer 112. An RDL 504 has been formed on the first layer of material 302. An additional planarization process can be optionally performed on the second layer of material 502 to reduce any step-height transitions and further improve the pitch of subsequent RDLs in subsequent layers of material. In addition, vias 532 may be formed to electrically connect with the RDL 504 and extend to a top surface 506 of the second layer of material 502. FIG. 6 shows a cross section 600 after an $(N+1)^{th}$ layer of material 602 has been formed on the reconstituted wafer 112. An $N^{th}$ RDL 604 has been formed on the $N^{th}$ layer of material (e.g., second layer of material 502). An additional planarization process can optionally be performed on the $(N+1)^{th}$ layer of material 602 to reduce any step-height transitions and further improve the pitch of subsequent RDLs in subsequent layers of material. In addition, vias 632 may be formed to electrically connect with the $N^{th}$ RDL 604 and extend to a top surface 606 of the $(N+1)^{th}$ layer of material 602. N represents a positive integer greater than 1.

Figure 7:
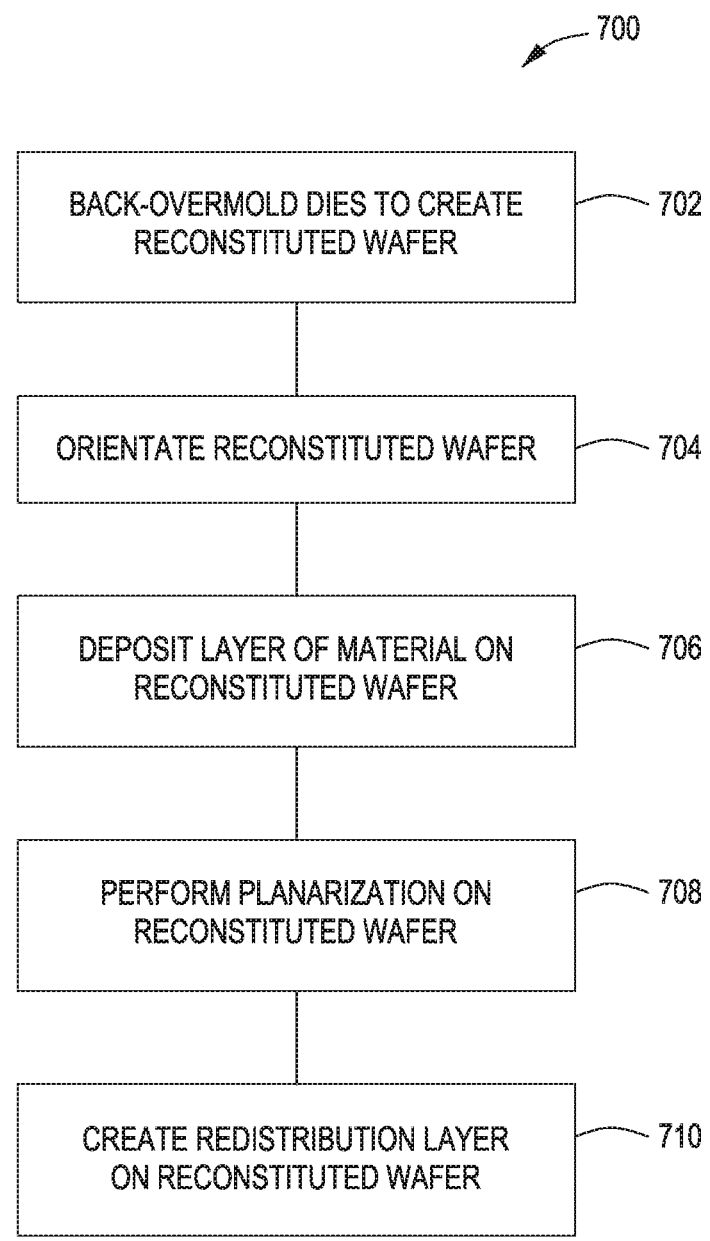
FIG. 7 is a method of processing a reconstituted wafer in accordance with some embodiments of the present principles.

In FIG. 7, a method 700 for processing semiconductors is depicted. Although the method 700 is shown in a functional block diagram of a particular order, processes are not required to be performed in one particular order. Some processes can be repeated and some groupings of processes can be repeated. In the same fashion, some processes may be accomplished prior to other processes and the like. The method 700 starts by back-overmolding dies to create a reconstituted wafer 702. The dies are picked and placed from, for example, one or more singulated wafers. The dies may come from different wafers and may be of varying sizes and thicknesses as well. The overmolding compound is poured over the back side (non-active side) of the dies while the active side of the dies is facing down. The reconstituted wafer is then oriented (e.g., flipped over) for further processing 704. The orienting process exposes the active sides of dies of the reconstituted wafer. In some embodiments, a carrier can used to provide rigidity of the reconstituted wafer during subsequent processing. A layer of material is then deposited on the reconstituted wafer as described previously 706. Connectivity structures such as copper interconnects/structures and other structures may also be formed on the reconstituted wafer along with the layer of material. The layer of material can be a polymer-based material or other material. The layer of material can be deposited using processes such as spin coating and other processes. The spin coating can be accomplished using a spin coating tool and/or other deposition tool such as an atomic layer deposition (ALD) tool or a physical vapor deposition (PVD) tool and the like.

A planarization process is then performed on the reconstituted wafer to reduce step-height transitions between the dies and adjacent surfaces 708, such as, for example, the surfaces of the overmolding compound. The planarization process can include CMP, back-grinding, and/or other processes to planarize the reconstituted wafer. In some embodiments, a CMP process can be performed with a duration of approximately 1 minute to approximately 30 minutes. Planarization processes are typically performed at room temperature (approximately 15 degrees Celsius to approximately 30 degrees Celsius). The planarization process temperature can be increased and is bounded only by temperature limitations of the overmolding compound. For example, a typical overmolding compound is generally workable in a temperature of less than approximately 160 degrees Celsius. An RDL is then formed on the reconstituted wafer 710. In some embodiments, planarization can be performed on the subsequent layers of material such as, for example, polymer layers. In some embodiments, the processes of the present principles advantageously provide a reduced step-height of approximately greater than 0 μm to less than or equal to approximately 1 μm and redistribution layers with at least two lead outs with line and spacing of approximately greater than 0/0 μm to less than or equal to approximately 2/2 μm.

Figure 8:
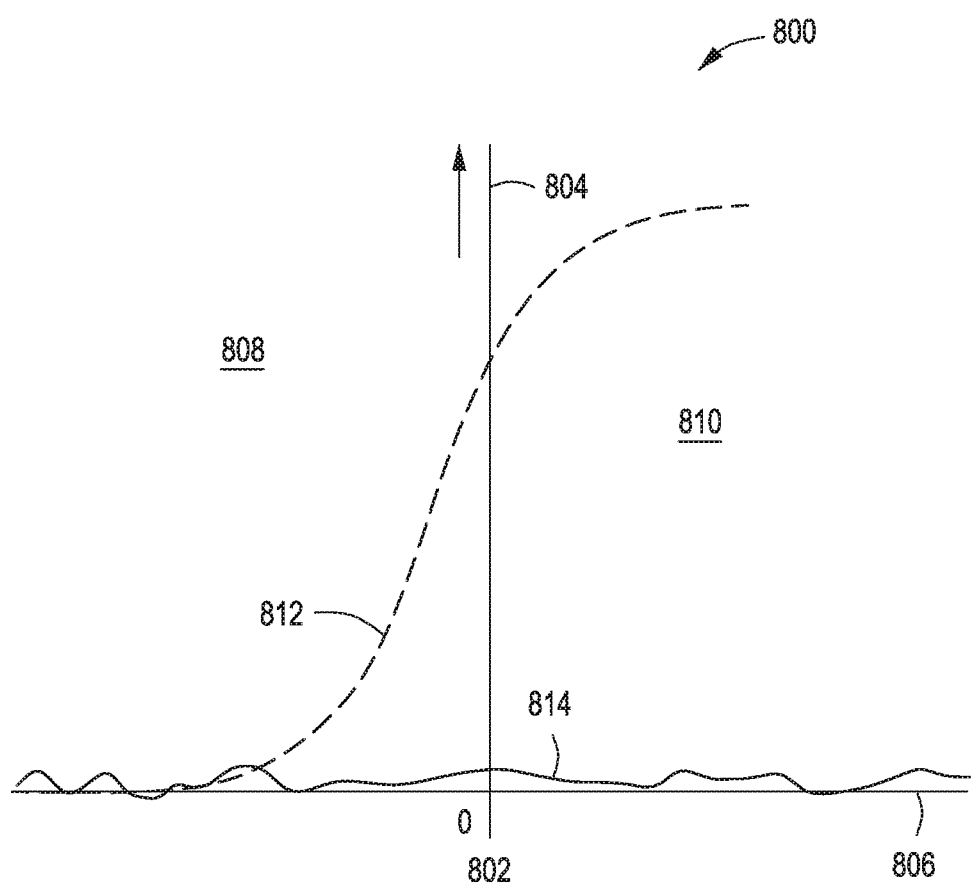
FIG. 8 is a graph illustrating improvements obtained in accordance with some embodiments of the present principles.

FIG. 8 illustrates a graph 800 showing the substantial reduction of step-height achievable with some embodiments of the present processes. A transition point 802 between a surface 810 of a die and an adjacent surface 808 is shown. A vertical axis 804 represents step-height distance between surfaces from 0 to infinity. A horizontal axis 806 represents distance from the transition point 802 which is used as an origination point '0'. In a typical process, step-height values are shown as a dashed line 812. As can be seen from the graph 800, the step-height of the adjacent surface 808 begins low and drastically increases at the transition point 802 to the surface 810 of the die (moving left to right in the graph 800). Some embodiments of the present principles advantageously yield results as shown by a solid line 814. The benefit of a substantial reduction in step-height is seen in the graph 800 when using embodiments of the present processes represented by solid line 814 when compared to the typical processes represented by dashed line 812.

While the foregoing is directed to embodiments of the present principles, other and further embodiments of the principles may be devised without departing from the basic scope thereof.

The invention claimed is:
1. A method of processing a semiconductor substrate, comprising:
   overmolding a non-active side of at least one die to form a reconstituted wafer;

orienting the reconstituted wafer to expose a first side with at least one active side of the at least one die;

depositing a first layer of polymer-based material on the first side of the reconstituted wafer; and planarizing the first layer of polymer-based material without exposing the active side of the at least one die.

2. The method of claim 1, further comprising:

forming at least one via in the first layer of polymer-based material after planarizing the first layer of polymer-based material, the via electrically connecting with the at least one die and extending to a first surface of the first layer of polymer-based material.

3. The method of claim 1, further comprising:

forming a first redistribution layer on the reconstituted wafer;

depositing a second layer of polymer-based material over the first redistribution layer; and planarizing the second layer of polymer-based material formed on the first redistribution layer.

4. The method of claim 3, further comprising:

forming a redistribution layer on the at least one active side with at least two lead outs with line and spacing of approximately greater than 0/0 µm to less than or equal to approximately 2/2 µm.

5. The method of claim 3, further comprising:

forming at least one via in the second layer of polymer-based material after planarizing the second layer of polymer-based material, the via electrically connecting with the first redistribution layer and extending to a second surface of the second layer of polymer-based material.

6. The method of claim 1, further comprising using a carrier on a second side of the reconstituted wafer to provide rigidity during subsequent processing.

7. The method of claim 1, further comprising creating structures on the reconstituted wafer before depositing the first layer of polymer-based material on the reconstituted wafer.

8. The method of claim 1, further comprising:

planarizing the first layer of polymer-based material using chemical-mechanical planarization.

9. The method of claim 1, further comprising:

depositing at least one layer of polymer-based material on the reconstituted wafer using a spin coating process.

10. A method of processing a semiconductor substrate, comprising:

placing at least one die on a substrate surface with at least one active side of the at least one die towards the substrate surface;

overmolding at least one non-active side of the at least one die to form a reconstituted wafer;

curing the overmolding;

releasing the reconstituted wafer from the substrate surface and exposing a first side of the reconstituted wafer with the at least one active side of the at least one die;

spin coating a first polymer layer on the first side of the reconstituted wafer; and chemical-mechanical planarizing the first polymer layer to reduce step-height distance in proximity of a transition point of the at least one die and an adjacent surface.

11. The method of claim 10, further comprising:

reducing at least one step-height until the at least one step-height is approximately greater than 0 µm to less than or equal to approximately 1 µm.

12. The method of claim 10, further comprising:

forming at least one via in the first polymer layer after chemical-mechanical planarizing the first polymer layer, the via electrically connecting with the at least one active side of the at least one die and extending to a first surface of the first polymer layer.

13. The method of claim 10, further comprising:

forming a first redistribution layer on the reconstituted wafer;

spin coating a second polymer layer over the first redistribution layer; and chemical-mechanical planarizing the second polymer layer formed on the first redistribution layer.

14. The method of claim 13, further comprising:

forming a redistribution layer on the at least one active side with at least two lead outs with line and spacing of approximately greater than 0/0 µm to less than or equal to approximately 2/2 µm.

15. The method of claim 13, further comprising:

forming at least one via in the second polymer layer after chemical-mechanical planarizing the second polymer layer, the via electrically connecting with the first redistribution layer and extending to a second surface of the second polymer layer.

16. The method of claim 10, further comprising using a carrier on a second side of the reconstituted wafer to provide rigidity during processing.

17. The method of claim 10, further comprising creating structures on the reconstituted wafer before depositing the first polymer layer on the reconstituted wafer.

* * * * *

UNITED STATES PATENT AND TRADEMARK OFFICE
CERTIFICATE OF CORRECTION

PATENT NO. : 10,515,927 B2
APPLICATION NO. : 15/634012
DATED : December 24, 2019
INVENTOR(S) : Prayudi Lianto et al.

Page 1 of 1

It is certified that error appears in the above-identified patent and that said Letters Patent is hereby corrected as shown below:

In the Specification

Column 4, Line 12 - delete "In Fig 10," and replace with "In FIG. 1C,".

Signed and Sealed this
Fifth Day of May, 2020

Andrei Iancu
*Director of the United States Patent and Trademark Office*